US010844478B2

United States Patent
Trzcinski et al.

(10) Patent No.: US 10,844,478 B2
(45) Date of Patent: *Nov. 24, 2020

(54) CHROMIZING OVER CATHODIC ARC COATING

(71) Applicant: United Technologies Corporation, Farmington, CT (US)

(72) Inventors: Frank J. Trzcinski, Ellington, CT (US); Thomas Balzano, Manchester, CT (US); Prentice M. Sinesi, Cromwell, CT (US); Mark A. Livings, East Windsor, CT (US); Michael N. Task, Manchester, CT (US)

(73) Assignee: RAYTHEON TECHNOLOGIES CORPORATION, Farmington, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/516,455

(22) Filed: Jul. 19, 2019

(65) Prior Publication Data

US 2020/0017958 A1    Jan. 16, 2020

Related U.S. Application Data

(63) Continuation of application No. 15/103,761, filed as application No. PCT/US2014/066277 on Nov. 19, 2014, now Pat. No. 10,364,490.

(Continued)

(51) Int. Cl.
*C23C 14/58*    (2006.01)
*C23C 14/34*    (2006.01)
(Continued)

(52) U.S. Cl.
CPC .......... *C23C 14/5846* (2013.01); *B32B 15/04* (2013.01); *B32B 15/043* (2013.01);
(Continued)

(58) Field of Classification Search
CPC ......... C23C 10/10; C23C 10/30; C23C 10/38; C23C 10/32; C23C 14/16; C23C 14/5846;
(Continued)

(56) References Cited

U.S. PATENT DOCUMENTS

| 4,034,142 A | * | 7/1977 | Hecht ..................... B32B 15/01 |
| | | | 428/678 |
| 5,543,183 A | | 8/1996 | Streckert et al. |

(Continued)

FOREIGN PATENT DOCUMENTS

| EP | 0587341 A1 | 3/1994 |
| EP | 1361291 A2 | 11/2003 |

(Continued)

OTHER PUBLICATIONS

European Search Report for European Application No. 14869840.0 dated Jun. 20, 2017, 11 pages.

(Continued)

*Primary Examiner* — Michael E. La Villa
(74) *Attorney, Agent, or Firm* — Cantor Colburn LLP

(57) ABSTRACT

The present invention provides a Cr-rich cathodic arc coating, an article in turbine blade coated with the chromizing over cathodic arc coating, and a method to produce the coating thereof. The Cr-rich cathodic arc coating in the present invention comprises a cathodic arc coating and a diffusion coating deposited atop the cathodic arc coating to enforce hot corrosion resistance. The hardware coated with the chromizing over cathodic arc coating in the present invention is reinforced with superior-hot corrosion resistance. The present invention further provides a novel method for producing the chromizing over cathodic arc coating by re-sequencing coating deposition order. The method in the present invention is efficient and cost-reducing by eliminating some operations, e.g., DHT and peening, between the (Continued)

cathodic arc coating and the diffusion coating. The hot corrosion resistance in the present invention results from the high Cr content in the surface of the coating.

18 Claims, 6 Drawing Sheets

Related U.S. Application Data

(60) Provisional application No. 61/914,222, filed on Dec. 10, 2013.

(51) Int. Cl.
<table>
<tr><td>C23C 14/14</td><td>(2006.01)</td></tr>
<tr><td>C23C 14/16</td><td>(2006.01)</td></tr>
<tr><td>C23C 30/00</td><td>(2006.01)</td></tr>
<tr><td>C23C 28/02</td><td>(2006.01)</td></tr>
<tr><td>C23C 10/32</td><td>(2006.01)</td></tr>
<tr><td>C23C 10/10</td><td>(2006.01)</td></tr>
<tr><td>C23C 10/20</td><td>(2006.01)</td></tr>
<tr><td>C23C 10/38</td><td>(2006.01)</td></tr>
<tr><td>F01D 5/28</td><td>(2006.01)</td></tr>
<tr><td>B32B 15/04</td><td>(2006.01)</td></tr>
</table>

(52) U.S. Cl.
CPC .............. *C23C 10/10* (2013.01); *C23C 10/20* (2013.01); *C23C 10/32* (2013.01); *C23C 10/38* (2013.01); *C23C 14/14* (2013.01); *C23C 14/16* (2013.01); *C23C 14/34* (2013.01); *C23C 14/3464* (2013.01); *C23C 14/5806* (2013.01); *C23C 28/02* (2013.01); *C23C 28/021* (2013.01); *C23C 28/022* (2013.01); *C23C 30/00* (2013.01); *C23C 30/005* (2013.01); *F01D 5/28* (2013.01); *F01D 5/288* (2013.01); *F05D 2220/32* (2013.01); *F05D 2230/90* (2013.01); *F05D 2300/177* (2013.01); *F05D 2300/611* (2013.01); *Y10T 428/12847* (2015.01); *Y10T 428/12854* (2015.01); *Y10T 428/12931* (2015.01); *Y10T 428/12937* (2015.01); *Y10T 428/12979* (2015.01)

(58) Field of Classification Search
CPC ..... C23C 14/14; C23C 14/34; C23C 14/3464; C23C 14/5806; C23C 28/022; C23C 28/021; C23C 28/02; C23C 30/00; C23C 30/005; C23C 10/20; F05D 2230/90; F05D 2220/32; F01D 5/288; F01D 5/28; F01D 2300/177; F01D 2300/611; Y10T 428/12931; Y10T 428/12937; Y10T 428/12979; Y10T 428/12847; Y10T 428/12854; B32B 15/04; B32B 15/043
See application file for complete search history.

(56) References Cited

U.S. PATENT DOCUMENTS

<table>
<tr><td>5,932,078</td><td>A</td><td>8/1999</td><td>Beers et al.</td></tr>
<tr><td>5,993,980</td><td>A</td><td>11/1999</td><td>Schmitz et al.</td></tr>
<tr><td>6,224,726</td><td>B1</td><td>5/2001</td><td>Beers et al.</td></tr>
<tr><td>10,364,490</td><td>B2 *</td><td>7/2019</td><td>Trzcinski ............ C23C 14/5806</td></tr>
<tr><td>2001/0053410</td><td>A1</td><td>12/2001</td><td>Fernihough et al.</td></tr>
<tr><td>2005/0214563</td><td>A1 *</td><td>9/2005</td><td>Feng .................... C23C 4/02<br>428/629</td></tr>
<tr><td>2009/0035485</td><td>A1</td><td>2/2009</td><td>Minor</td></tr>
<tr><td>2010/0266409</td><td>A1</td><td>10/2010</td><td>Chandra et al.</td></tr>
<tr><td>2013/0040166</td><td>A1</td><td>2/2013</td><td>Box et al.</td></tr>
</table>

FOREIGN PATENT DOCUMENTS

<table>
<tr><td>EP</td><td>1788125 A2</td><td>5/2007</td></tr>
<tr><td>WO</td><td>2010097577 A1</td><td>9/2010</td></tr>
<tr><td>WO</td><td>2010138096 A1</td><td>12/2010</td></tr>
</table>

OTHER PUBLICATIONS

Notification of Transmittal of the International Search Report of the International Searching Authority, or the Declaration; PCT/US2014066277; dated Mar. 18, 2015. 3 pages.

Notification of Transmittal of the Written Opinion of the International Searching Authority, or the Declaration; PCT/US2014/066277; dated Mar. 18, 2015. 9 pages.

* cited by examiner

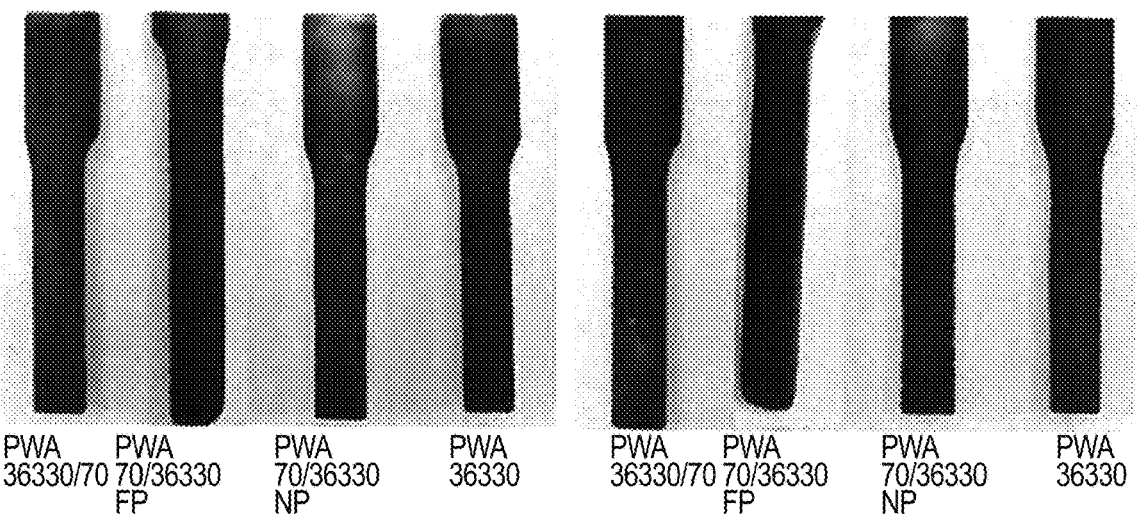
FIG. 5A
FIG. 5B
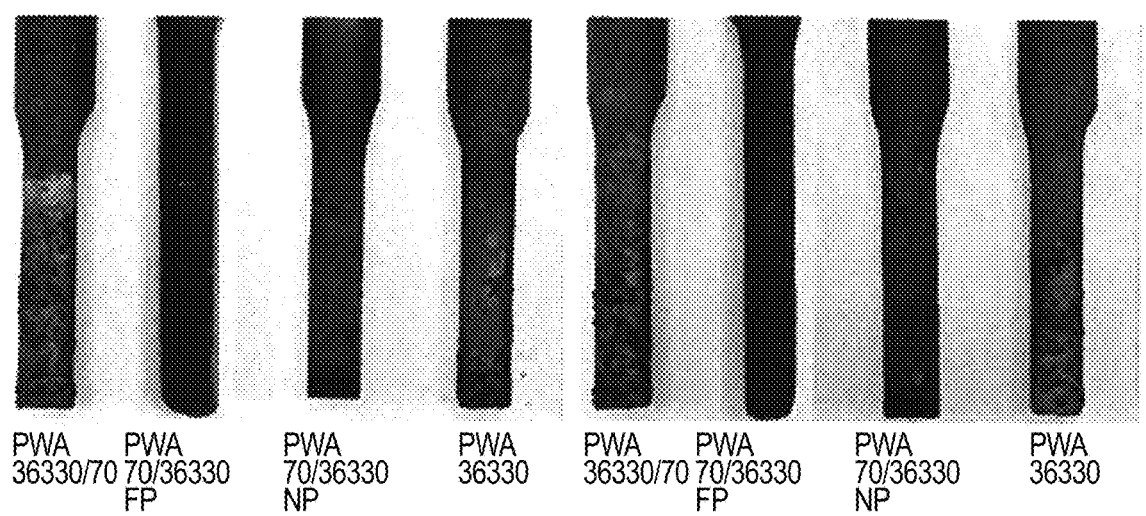
FIG. 5C
FIG. 5D
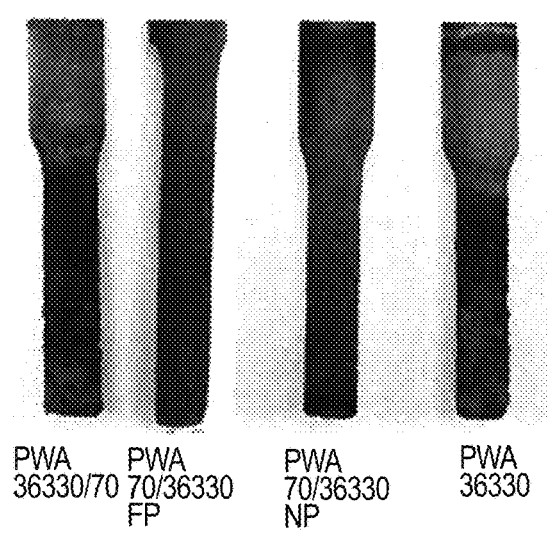
FIG. 5E

CHROMIZING OVER CATHODIC ARC COATING

RELATED APPLICATIONS

This application is a continuation of U.S. patent application Ser. No. 15/103,761 filed on Jun. 10, 2016 which is a National Phase Application of Patent Application PCT/US2014/066277 filed on Nov. 19, 2014, which claims the benefit of and priority to U.S. Provisional Patent Application No. 61/914,222, filed Dec. 10, 2013, the contents each of which are incorporated herein by reference in their entirety.

FIELD OF THE INVENTION

This invention relates to a Cr-rich cathodic arc coating which provides superior hot corrosion resistance, an article with such Cr-rich cathodic arc coating, and a method to produce the Cr-rich cathodic arc coating by re-sequencing coating deposition order.

BACKGROUND

High-temperature corrosion (hot corrosion) is a mechanism of corrosion that takes place in gas turbines, diesel engines, furnaces or other machinery coming in contact with hot gas containing certain contaminants. The hardware of such machinery, e.g., a turbine blade, is continuously threatened by extreme hot corrosion. In such region of gas turbines or engines, subsequent coating may be applied to provide a superior hot-corrosion resistance to gas turbines.

Many factors in such coating systems, both microstructural (grain size, distribution of second phase precipitates, etc.) and compositional (chemical homogeneity, bulk content of refractory metal, Cr, Co, Al, Y, Hf, etc.), can influence hot corrosion resistance performance. Among those, chromium (Cr) content is a key contributor to hot corrosion resistance. As such, it has been common to apply a secondary coating under the high chromium cathodic arc coating to increase hot-corrosion resistance.

Nevertheless, the conventional combined coating process requires considerable additional cost and causes significant loss in coating thickness due to aggressive grit blast and spallation. As such, there is a need to provide a coating which provides High-temperature corrosion (hot corrosion) resistance without the cost and loss associated with conventional methods.

SUMMARY OF THE INVENTION

The present invention provides a novel Cr-rich cathodic arc coating, an article coated with the Cr-rich cathodic arc coating and a method to produce the same.

In one embodiment, a chromium-rich cathodic arc coating comprising;
a MCrAlY, wherein M is a metal alloy comprising nickel, cobalt, iron, or a combination thereof, on a substrate; and
a diffused chromide coating atop the MCrAlY,
wherein a surface of the diffused chromide coating has high content of chromium.

In certain embodiments, the surface of the diffused chromide coating atop the MCrAlY contains chromium content from about 20% to about 50% by weight.

In other embodiment, the MCrAlY contains chromium content between about 25% and 50%, between about 25% and 40% or between about 25% and 35% by weight based on the weight of the MCrAlY.

In another embodiment, the MCrAlY comprises Co, Cr, Al, Hf, Y, or combinations thereof and the diffused chromide coating comprises a Cr rich phase.

In still another embodiment, the MCrAlY further comprises Si. In certain embodiments, the MCrAlY comprises Si in an amount of about 0.10-0.70% by weight based on the weight of the MCrAlY. In other embodiments, the MCrAlY comprises Si in an amount of about 0.15-0.65% by weight based on the weight of the MCrAlY.

In particular embodiment, the chromium-rich cathodic arc coating is resistant to hot corrosion at a temperature between about 1200° F. and 1600° F.

In another particular embodiment, the chromium-rich cathodic arc coating is resistant to stress corrosion or to low cycle fatigue.

Still in another certain embodiments, the substrate comprises a blade root, internal surface of turbine blade. In particular embodiments, the substrate can be the external surface of a blade, in whole or in part.

According to the present invention, an article blade comprising:
a substrate;
a MCrAlY on a substrate, wherein M is a metal alloy comprising nickel, cobalt, iron, or a combination thereof; and
a diffused chromide coating atop the MCrAlY.
wherein a surface of the diffused chromide coating atop the MCrAlY has high content of chromium.

In another embodiment, the MCrAlY comprises Co, Cr, Al, Hf, Y, or combinations thereof and the diffused chromide coating comprises a Cr rich phase.

In still another embodiment, the MCrAlY further comprises Si. In certain embodiments, the MCrAlY comprises Si in an amount of about 0.10-0.70% by weight based on the weight of the MCrAlY. In other embodiments, the MCrAlY comprises Si in an amount of about 0.15-0.65% by weight based on the weight of the MCrAlY.

According to the present invention, a method of producing a chromium-rich cathodic arc coating comprises steps of:
applying a MCrAlY on a substrate, wherein M is a metal alloy comprising nickel, cobalt, iron, or a combination thereof; and
applying a diffused chromide coating atop the MCrAlY;
wherein a surface of the diffused chromide coating atop the MCrAlY has high content of chromium.

In some embodiments, the diffused chromide coating contains chromium content upwards of 20% to about 50% by weight.

In other embodiment, the MCrAlY contains chromium content between about 25% and 50%, between about 25% and 40% or between about 25% and 35% by weight based on the weight of the MCrAlY.

In particular embodiments, the method of applying the MCrAlY comprises cathodic arc physical vapor deposition. In another particular embodiments, the method of applying the diffused chromide coating atop the MCrAlY comprises pack chromizing, slurry chromizing, vapor diffusion coating, or gas diffusion coating. In certain embodiments, the diffused chromide coating is applied at an elevated temperature from about 1800-2200° F., from about 1900-2100° F., or from about 1925-2000° F.

BRIEF DESCRIPTION OF THE DRAWINGS

So that those skilled in the art to which the subject disclosure appertains will readily understand how to make and use the devices and methods of the subject disclosure without undue experimentation, preferred embodiments thereof will be described in detail herein below with reference to certain figures, wherein:

FIG. 5 shows macroscopic images of sample substrates, which are coated with in each MCrAlY only; MCrAlY/diffused chromide coating FP; MCrAlY/diffused chromide coating NP, view after: a: 21 hours; b: 315 hours; c: 415 hours; d: 737 hours; e: 980 hours of hot corrosion testing at 1350° F.

DETAILED DESCRIPTION

Figure 1:
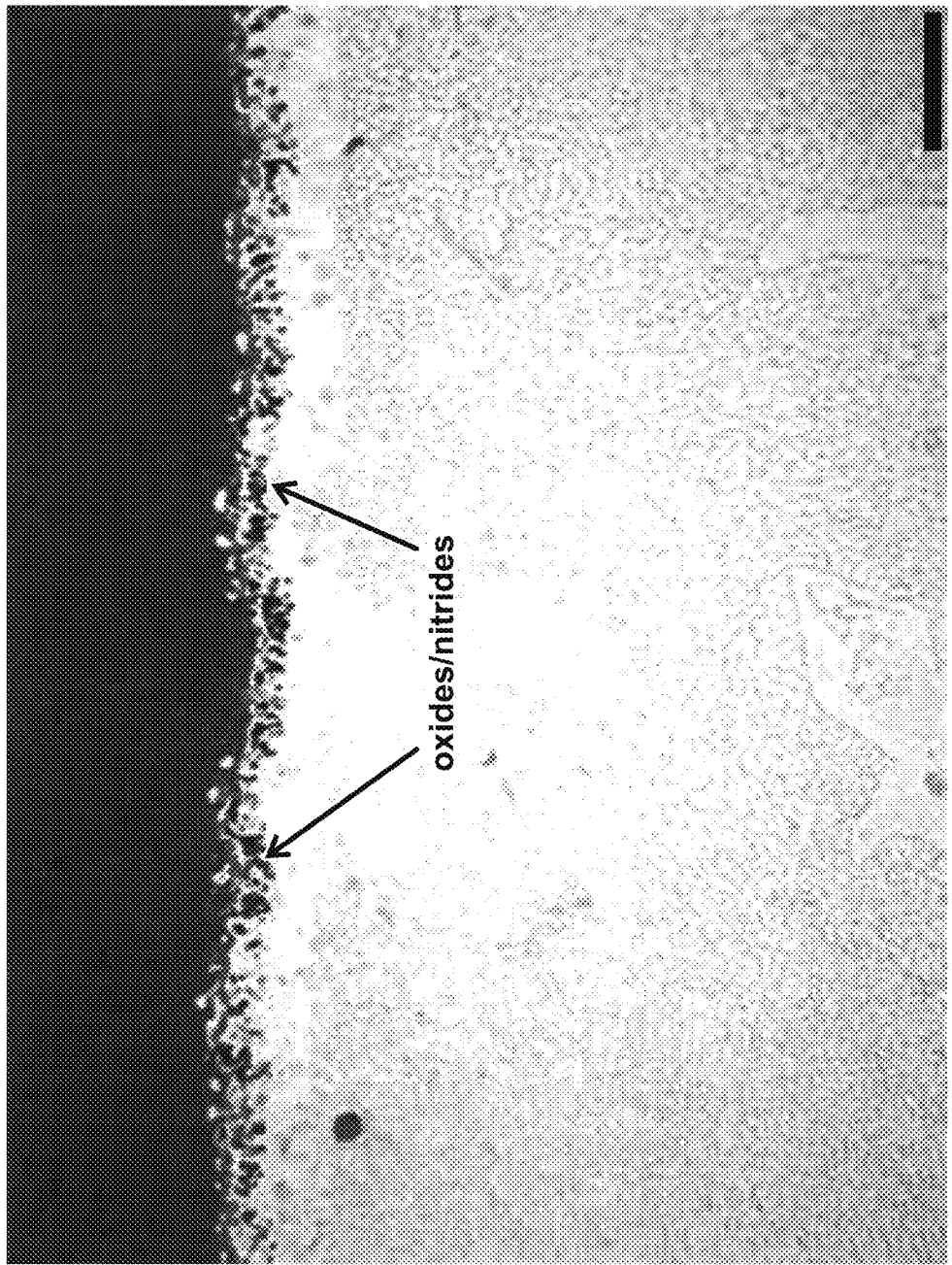
FIG. 1 shows an optical micrographic view of a conventional diffusion coating, demonstrating the presence of oxide and nitride inclusions on the top portion.
Figure 2B:
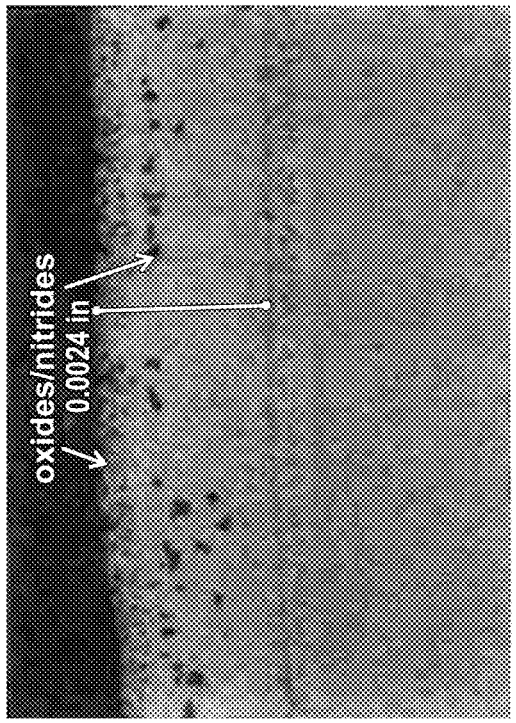
FIG. 2 shows optical microscopic views of coating on a substrate; a) MCrAlY only; b) diffused chromide coating/MCrAlY with full preparation of cathodic arc coating; c) diffused chromide coating/MCrAlY with no preparation of cathodic arc coating; d) MCrAlY/diffused chromide coating.
Figure 2D:
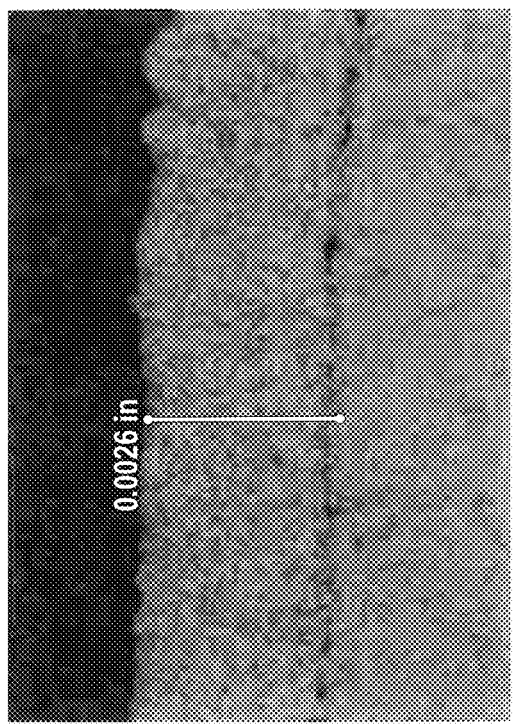
Figure 2A:
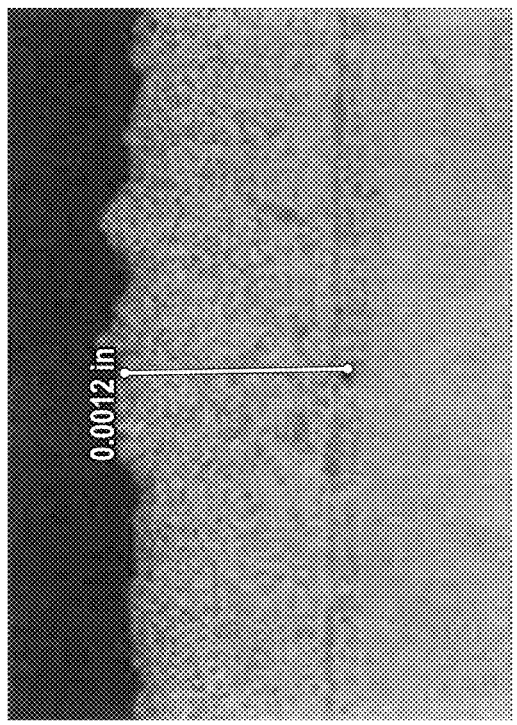
Figure 2C:
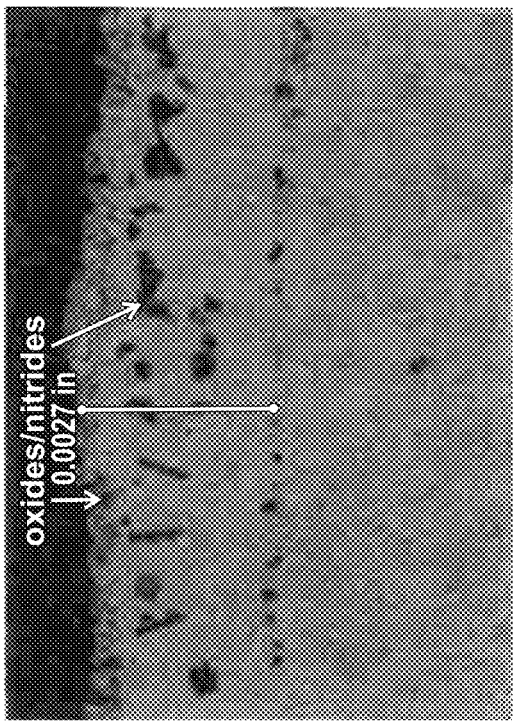

The present invention provides a chromium-rich cathodic arc coating, an article coated with the chromizing over cathodic arc coating, and a method to produce thereof.

Definition

As used herein the term "chromium-rich" refers to an elevated chrome composition in coating material exhibiting excellent hot corrosion resistance. In certain embodiments, the surface of "chromium-rich" coating contains upwards of 40% of chromium content by weight based on the weight of coating.

As used herein the term "high-content" refers to a coating material having excessive amount of composition than a conventional coating. In certain embodiments, the term "high-content" chromium refers to chromium content in coating upwards of 40% by weight. In other embodiments, "high-content" chromium exhibits excellent hot corrosion resistance.

As used herein, the term "stress corrosion" refers to a defect or a failure due to tensile stress from environment.

As used herein, the term "low cycle fatigue" refers to a stress that is cycled until the damage to plastic or coating occurs at the low cycle number, generally $10^3$~$10^5$ cycles.

As used herein, the term "chromium rich phase" refers to area where the chromium content of an alloy substrate, coating or other metallic surface has been modified by a diffusion process that causes an increase in chromium content. In some embodiments, the chromium content of the diffused chromide coating is a high-content of chromium. In other embodiments, the chromium content of the diffused chromide coating is greater than about 10% chromium chromium, greater than about 15% chromium chromium, greater than about 20% chromium chromium, greater than about 25% chromium chromium, greater than about 30% chromium chromium, greater than about 35% chromium chromium, greater than about 40% chromium chromium, greater than about 45% chromium chromium, or greater than about 50% chromium chromium. In still other embodiments, the chromium rich phase has a specific depth. In particular embodiments, the depth of the chromium rich phase is from about 0.1 to about 25 thousandths of an inch, or from about 0.2 to 10 thousandths of an inch.

Hot Corrosion and Cr Content

During the operation of gas turbine, certain chemicals, such as sulfur species, are released at elevated operating temperature and react with environmental salts. As consequence, the corrosive contaminants deposit on the hot hardwares of gas turbine and accelerate corrosion of metallic substrates. This is generally referred to as "hot corrosion".

Even though the temperature of hot corrosion attack depends on the alloy composition, hot corrosion attack generally occurs at high temperature in the range of 1470° F.~1830° F. and low temperature in the range of 1200° F.~1380° F. The mechanism of hot corrosions are considered to be different between high temperature range and low temperature range, but Cr content is believed to be a key factor in alloy composition for enhancing the hot corrosion resistance in both temperature ranges. For example, a chromium content of no less than 37% is effective to provide hot corrosion resistance at both high and low temperature ranges, compared to the coating containing about 20% Cr.

The high Cr content in the alloy or coating results in formation of thin protective Cr-rich oxide scales on the surface. This Cr-rich oxide scale prevents the corrosive chemical contaminants from depositing on the hardware in gas turbine. Such protective oxide scale is also illustrated in FIGS. 5 and 6.

Cathodic Arc Coating: MCrAlY

A cathodic arc coating or deposition is a type of physical vapor deposition. The cathodic arc coating employs an electric arc to vaporize and ionize coating material, e.g., metal, ceramic, and composites, from the cathode. Then, the vaporized material forms a thin layer on the surface of the substrate. Many of metal based coating materials are applied using cathodic arc coating, including titanium, zirconium, chromium or alloys thereof.

In certain embodiments of the invention, MCrAlY is applied using cathodic arc coating. The MCrAlY is applied by, without limitation, using the cathodic arc physical vapor deposition method. According to the invention, the MCrAlY comprises chromium, cobalt, aluminum, hafnium, yttrium, or a combination thereof. In specific embodiments, the MCrAlY contains, without limitation, contains chromium content between about 20% to about 50% by weight. In other embodiment, the MCrAlY contains chromium content between about 25% and 50%, between about 25% and 40% or between about 25% and 35% by weight based on the weight of the MCrAlY.

In still other embodiments, the McrAlY further comprises Si. In certain embodiments, the McrAlY comprises Si in an amount of about 0.10-0.70% by weight based on the weight of the McrAlY. In other embodiments, the McrAlY comprises Si in an amount of about 0.15-0.65% by weight based on the weight of the McrAlY.

Diffusion Coating: Diffused Chromide Coating

Diffusion coating is a type of coating process by allowing alloy or coating materials diffuse to under-layer at high temperature. The diffused coating material imparts alternative chemical compositions to base materials in order to improve physical or mechanical properties. Based on the different elements in composition of material, diffusion coating can be aluminizing, chromizing, molybdenization, manganizing, chrome calorization, and chrome-titanium plating. Diffusion of coating material is available from solid, gas, vapor, or liquid phase. Because the diffusion coating performs at high temperature, e.g. 1800° F., some elements of under-lying base or other coating may diffuse during the process.

In certain embodiments in the invention, the diffused chromide coating is applied by diffusion coating process. In particular embodiments, the diffused chromide coating is applied by pack chromizing, slurry chromizing, vapor diffusion coating, or gas diffusion coating. In certain embodiments, the diffused chromide coating is applied at an elevated temperature from about 1800-2200° F., from about 1900-2100° F., or from about 1925-2000° F.

Figure 3:
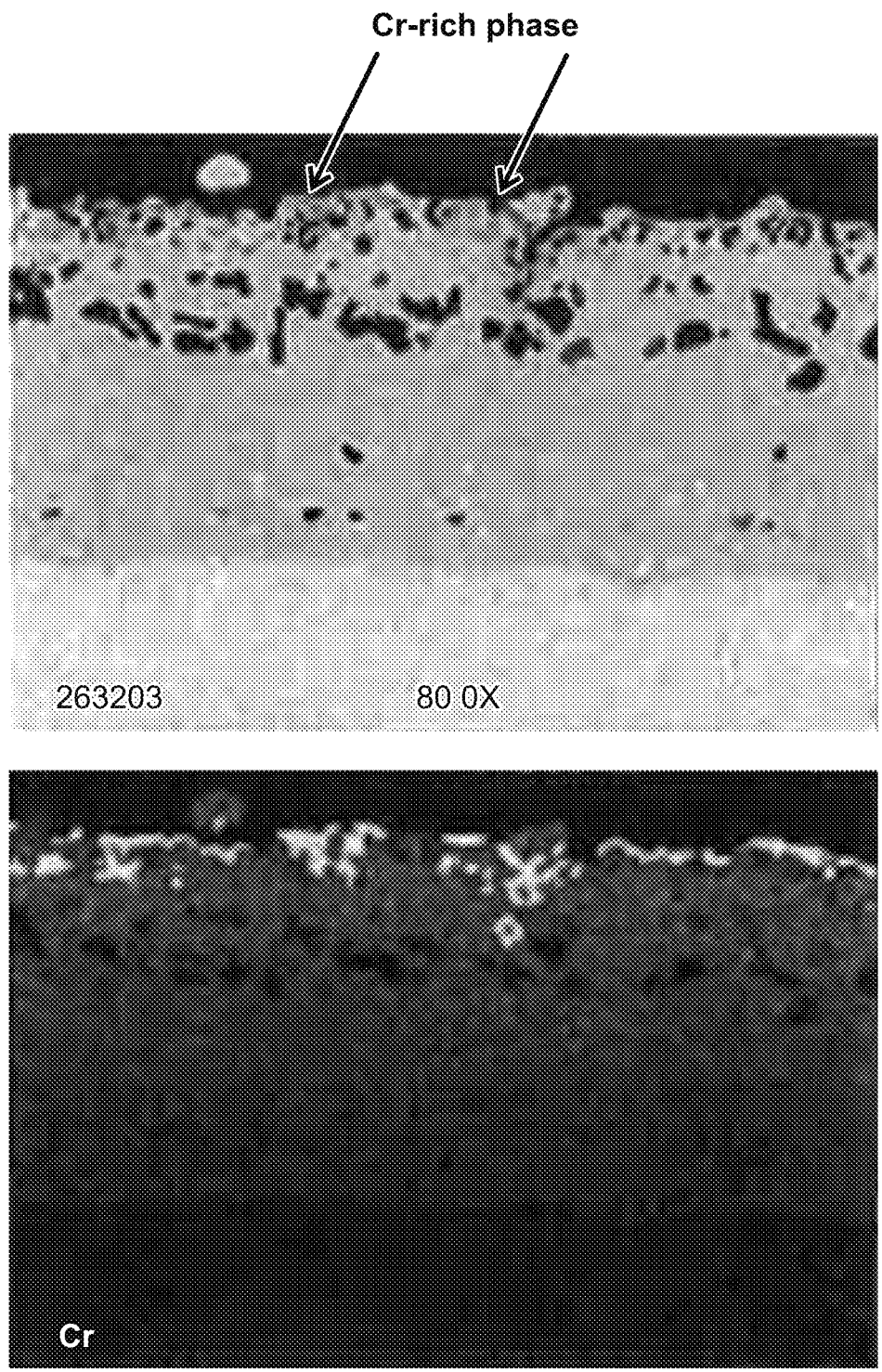
FIG. 3 shows a SEM image and a Cr X-ray map showing a formation of an elevated Cr-rich phase on the surface of the Cr-rich cathodic arc coating.

In certain embodiments of the invention, high content of Cr from the MCrAlY of base coating diffuses during subsequent diffusion coating process. For example, the cathodic arc coating may contain a high content of Cr initially which, during the diffusion coating atop the MCrAlY, diffuses toward the surface. As consequence, the surface contains higher Cr content than MCrAlY alone or a coating of MCrAlY atop a diffused chromide coating surface. As evidence, FIG. 3 shows a nearly continuous chromium-rich single phase at the surface of diffused chromide coating from the diffusion coating deposition.

Methods

The present invention provides a novel method for producing chromium-rich cathodic arc coating diffused chromide coating/MCrAlY by depositing the diffused chromide coating surface atop the cathodic arc coating. By coating the substrate in this method, the coating process in the present invention does not require subsequent post-treatment, such as grit blast, diffusion heat treatment (DHT), or peening operation, on the underlying cathodic arc coating MCrAlY, thereby reducing cost and time significantly. Furthermore, the chromium-rich cathodic arc coating by this method acquires highly improved hot corrosion resistance. Meanwhile, no negative influence during low cycle fatigue (LCF) test or strain to crack (StC) test has been identified compared to the conventional MCrAlY coating, MCrAlY/diffused chromide coating, or the fully treated diffused chromide coating/MCrAlY.

According to the present invention, a method of producing a chromium-rich cathodic arc coating comprising steps of:

a) applying MCrAlY on a substrate, wherein M is a metal alloy comprising nickel, cobalt, iron, or a combination thereof;

b) applying diffused chromide coating atop MCrAlY;

wherein a surface of diffused chromide coating atop MCrAlY has high content of chromium.

In certain embodiments, the surface of the diffused chromide coating contains chromium content of about 20% to about 50% by weight. In other embodiment, the MCrAlY contains chromium content between about 25% and 50%, between about 25% and 40% or between about 25% and 35% by weight based on the weight of the MCrAlY.

In another embodiment, the MCrAlY comprises CO, Cr, Al, Hf, Y, or combinations thereof and the diffused chromide coating comprises a Cr rich phase.

In still another embodiment, the McrAlY further comprises Si. In certain embodiments, the McrAlY comprises Si in an amount of about 0.10-0.70% by weight based on the weight of the McrAlY. In other embodiments, the McrAlY comprises Si in an amount of about 0.15-0.65% by weight based on the weight of the McrAlY.

In particular embodiments, the method of applying the MCrAlY comprises cathodic arc physical vapor deposition. In another particular embodiments, the method of applying the diffused chromide coating atop the MCrAlY comprises pack chromizing, slurry chromizing, vapor diffusion coating, or gas diffusion coating.

In certain embodiments, the diffused chromide coating is applied at an elevated temperature from about 1800-2200° F., from about 1900-2100° F., or from about 1925-2000° F.

An Article with the Chromium-Rich Coating

The article coated with the chromium-rich cathodic arc coating in the present invention is reinforced with superior hot-corrosion resistance. The article taking advantages from the chromium-rich cathodic arc coating may be a part of gas turbine engine of aircraft.

According to the present invention, an article in a turbine blade comprises:

a substrate;

a MCrAlY on the substrate, wherein M is a metal alloy comprising nickel, cobalt, iron, or a combination thereof; and a diffused chromide coating atop the MCrAlY;

wherein a surface of the diffused chromide coating atop the MCrAlY has high content of chromium.

In one embodiment, the substrate comprises a blade root, the internal surface of turbine blade, or the external surface of a turbine blade. In another embodiment, the MCrAlY comprises CO, Cr, Al, Hf, Y, or combinations thereof and the diffused chromide coating comprises a Cr rich phase.

In particular embodiments, the method of applying the MCrAlY comprises cathodic arc physical vapor deposition. In another particular embodiments, the method of applying the diffused chromide coating atop the MCrAlY comprises pack chromizing, slurry chromizing, vapor diffusion coating, or gas diffusion coating.

In certain embodiments, the diffused chromide coating is applied at an elevated temperature from about 1800-2200° F., from about 1900-2100° F., or from about 1925-2000° F.

A better understanding of the present invention may be obtained through the following examples which are set forth to illustrate, but are not to be construed as limiting the present invention.

Example 1: Operation to Produce Coating Specimens

The processes to deposit the various coating specimens in the present application are summarized in Table 1.

TABLE 1

Definition of the processes to deposit the coatings specimens

| coating specimen | Operations | | | | | | | |
|---|---|---|---|---|---|---|---|---|
| | cathodic arc coating | DHT | peening | diffusion coating | heavy grit blast | cathodic arc coating | DHT | peening |
| MCrAlY | 1 | 2 | 3 | | | | | |
| MCrAlY/diffused chromide coating | | | | 1 | 2 | 3 | 4 | 5 |
| diffused chromide coating/MCrAlY (FP) | 1 | 2 | 3 | 4 | | | | |
| diffused chromide coating/MCrAlY (NP) | 1 | | | 2 | | | | |

A conventional cathodic arc coating MCrAlY is used as a baseline in the hot corrosion and LCF tests.

The coating specimen MCrAlY/Diffused chromide coating is processed by the conventional method by depositing sequentially a diffusion coating, heavy grip blast to remove the coating surface, and a cathodic arc coating, followed by DHT and peening operation. The MCrAlY/Diffused chromide coating specimen is also used as a baseline in the hot corrosion and LCF tests.

The coating specimen diffused chromide coating/MCrAlY (FP) and the coating specimen diffused chromide coating/MCrAlY (NP) are produced by the procedure in the invention. As shown in Table 1, the specimen diffused chromide coating/MCrAlY (FP) is "fully prepared (FP)" Cr-rich cathodic arc coating with DHT and peening operation inbetween cathodic arc deposition and a diffusion coating, and namely FP Cr-rich cathodic arc coating. The coating specimen diffused chromide coating/MCrAlY (NP) is "not prepared (NP)" with such operation after cathodic arc deposition, namely NP Cr-rich cathodic arc coating.

Example 2: Formation of Chromizing Over Cathodic Arc Coating

FIG. 2 shows optical microscopic views of each coating specimen.

Nominal coating thicknesses are between about 2.5 mil and 3 mil.

MCrAlY and MCrAlY/diffused chromide coating specimens are observed to have consistent microstructures as previously predicted.

In contrast, diffused chromide coating/MCrAlY (FP) and diffused chromide coating/MCrAlY (NP) specimen coatings contain oxides/nitrides inclusions. The majority of these coatings was found to be single phase, likely γ-Ni FCC solid solution, due to Cr enrichment resulting from the diffusion coating deposition. Angular Al-rich phases, like nitrides, resulting from the diffusion coating process, are visible in these coatings as well.

As shown in the SEM image and associated Cr x-ray map in FIG. 3, the deposition of diffused chromide coating atop MCrAlY on a scrap blade results in the formation of a nearly continuous highly elevated Cr-rich phase at the surface.

Example 3: Low Cycle Fatigue (LCF) Test Result

LCF tests were performed with the coating specimens at the temperature of 1200° F.

Figure 4:
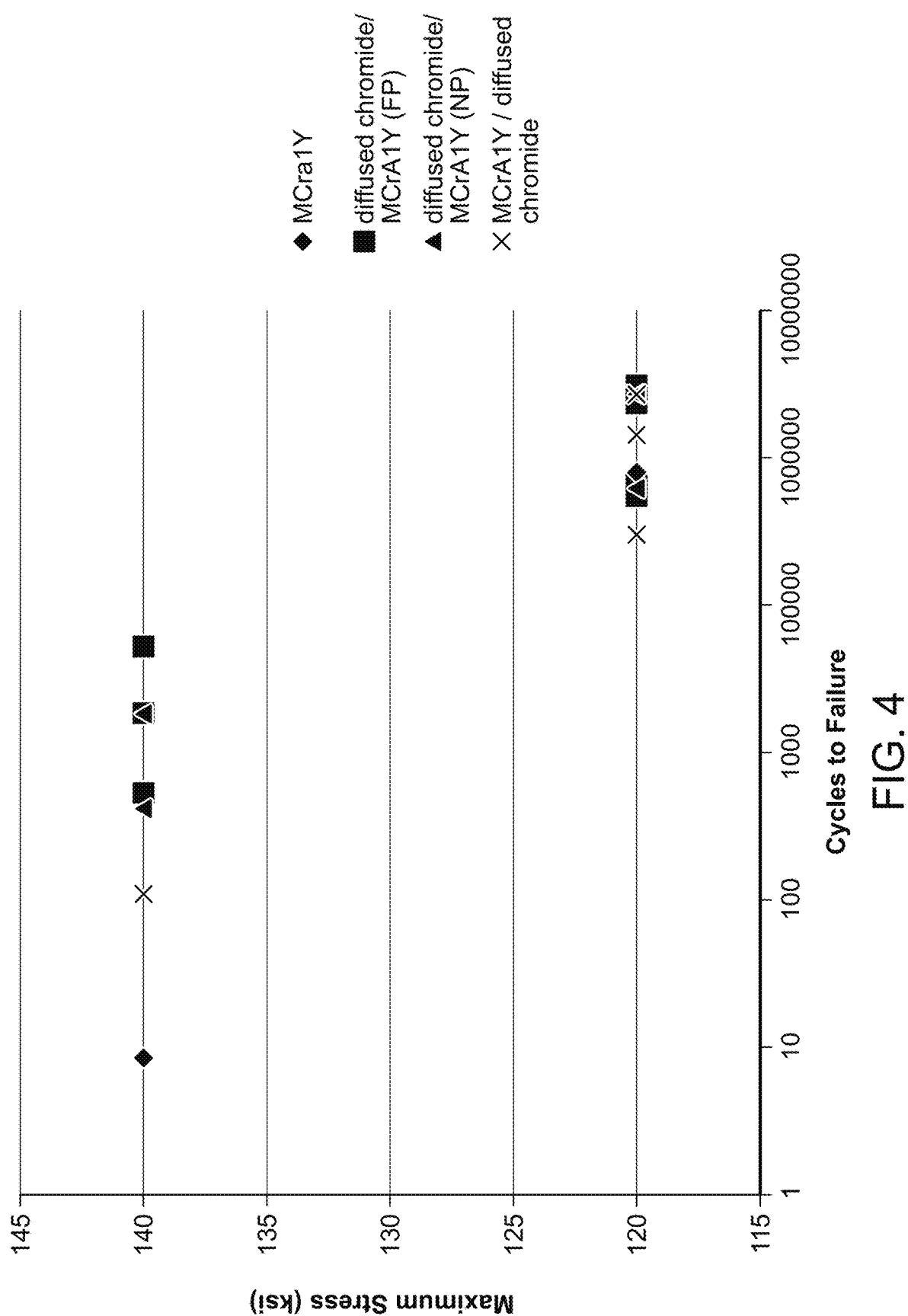
FIG. 4 is a plot of maximum stress vs. cycles showing failure point to LCF test with each coating specimen.
Figure 6A:
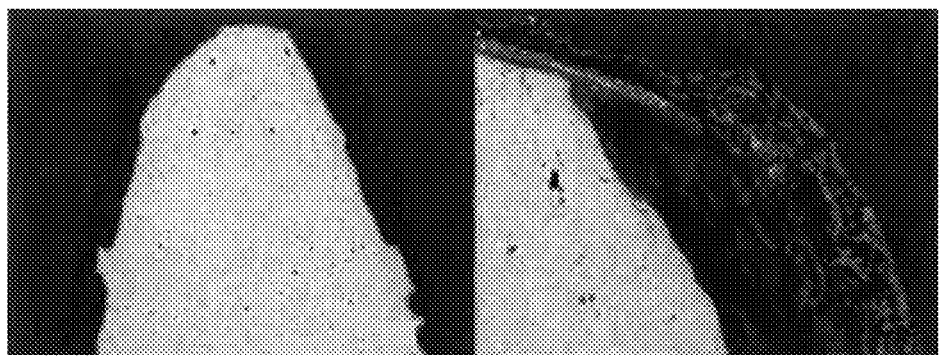
FIG. 6 shows microscopic images of sample substrates after 980 hours of hot corrosion testing at 1350° F.; with MCrAlY/diffused chromide coating; MCrAlY/diffused chromide coating; MCrAlY/diffused chromide coating, coating specimens.
Figure 6B:
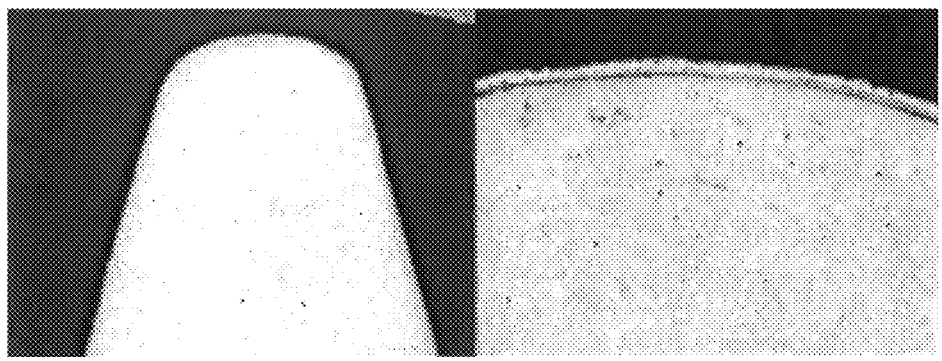
Figure 6C:
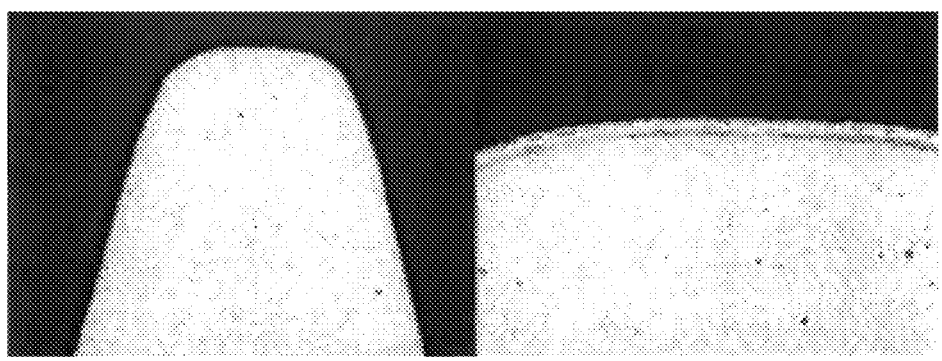
Figure 6D:

FIG. 4 shows a plot of maximum stress value vs. cycles to failure for each LCF testing. R value for this plot is 0.5.

Maximum stress value for each specimen was investigated within the range of 120 ksi-140 ksi. At a maximum stress of 120 ksi, no significant differences were observed between each coating specimen; failure generally occurred at approximately 100,000 cycles. At 140 ksi maximum stress, MCrAlY and MCrAlY/diffused chromide coating specimens failed within the first 100 cycles. diffused chromide coating/MCrAlY (FP) and diffused chromide coating/MCrAlY (NP) specimens failed at greater than 1000 cycles. There is no distinction between the test results of diffused chromide coating/MCrAlY (FP) and diffused chromide coating/MCrAlY (NP).

In conclusion, there is no indication that LCF resistance is associated with the preparation process, e.g., DHT and peening, to MCrAlY prior to diffused chromide coating. Furthermore, there was no observation of any LCF or strain to crack debit with the preparation process described.

Example 4: Strain to Crack Test at Different Operating Temperature

The strain to crack (StC) test were conducted with the coating specimens MCrAlY/diffused chromide coating, diffused chromide coating/MCrAlY (FP) and diffused chromide coating/MCrAlY (NP). The StC tests were performed at 600° F., 800° F., 1000° F., and 1200° F. and the test results are presented in Table 2.

TABLE 2

Coating strain to crack at various temperatures

| Coating specimen | Temperature (° F.) | Strain to Crack |
|---|---|---|
| MCrAlYI diffused chromide coating | 600 | 0.81 |
| diffused chromide coating/MCrAlY (FP) | 600 | No Cracking |
| diffused chromide coating/MCrAlY (NP) | 600 | No Cracking |
| MCrAlYI diffused chromide coating | 800 | 0.85 |
| diffused chromide coating/MCrAlY (FP) | 800 | No Cracking |
| diffused chromide coating/MCrAlY (NP) | 800 | No Cracking |
| MCrAlYI diffused chromide coating | 1000 | 0.88 |
| diffused chromide coating/MCrAlY (FP) | 1000 | No Cracking |
| diffused chromide coating/MCrAlY (NP) | 1000 | No Cracking |
| MCrAlYI diffused chromide coating | 1200 | No Cracking |

TABLE 2-continued

Coating strain to crack at various temperatures

| Coating specimen | Temperature (° F.) | Strain to Crack |
|---|---|---|
| diffused chromide coating/ MCrAlY (FP) | 1200 | No Cracking |
| diffused chromide coating/ MCrAlY (NP) | 1200 | No Cracking |

Each test was ceased if no coating cracking was observed at a pre-determined maximum strain. For example, at the 600° F., this maximum strain was set at 1% of cracking; for all other temperatures, the maximum strain was set at 2% of cracking.

Cracking was only observed with MCrAlY/diffused chromide coating at each temperature of 600° F., 800° F. and 1000° F.

None of MCrAlY/diffused chromide coating, diffused chromide coating/MCrAlY (FP) and diffused chromide coating/MCrAlY (NP) cracked at 1200° F.

Both diffused chromide coating/MCrAlY (FP) and diffused chromide coating/MCrAlY (NP) coatings specimen did not crack at any temperature over the range of 600° F. 1200° F. hot corrosion strain.

In conclusion, there is no indication that StC is associated with the preparation process, e.g., DHT and peening, to MCrAlY prior to diffused chromide coating. Furthermore, there was no observation of any LCF or strain to crack debit with the preparation process described.

Example 5: Burner Rig Hot Corrosion Exposures

The burner rig hot corrosion tests were conducted with the coating specimens. Each coating specimen was exposed at 1350° F. for 980 hours with 20 ppm sea salt in fuel and 30.5 Uh $SO_2$ in the gas stream. FIG. 5 shows macroscopic images of each specimen at time course exposure to the test.

After 415 hours of exposure, a thick non-protective corrosion scale was observed with MCrAlY and MCrAlY/diffused chromide coating. The thick non-protective corrosion scale is associated with rapid hot corrosion degradation. This hot corrosion degradation in those specimens occurred at approximately 415 hours and continued to worsen until the test was terminated.

In contrast, a thin protective oxide scale was formed and maintained on each coating of diffused chromide coating/MCrAlY (FP) and diffused chromide coating/MCrAlY (NP) throughout the exposure time. The thin protective oxide scale is associated with hot corrosion resistance.

FIG. 6 shows micrographic optical views of each coating specimen after 980 hours of hot corrosion test at 1350° F.

Majorities of the surface of MCrAlY and MCrAlY/diffused chromide coating coating were defeated over 980 hours of exposure with subsequent damages of the base substrate to maximum depths of approximately 20 mil.

In contrast, no significant damage was observed after 980 hours of exposure for diffused chromide coating/MCrAlY (FP) and diffused chromide coating/MCrAlY (NP).

In conclusion, the coating deposition of the diffusion coating atop the cathodic arc coating in the present invention improves the hot corrosion resistance significantly. Furthermore, there is no indication that hot corrosion resistance is associated with the preparation process, e.g., DHT and peening, to MCrAlY prior to diffused chromide coating.

Example 6: Preparation of an Article

A turbine blade is provided. To the turbine blade, a layer of cathodic arc coating comprising a combination of nickel, cobalt, and iron is applied. Following application of the cathodic art coating, a diffused chromide coating comprising a chromium rich phase is deposited on the cathodic arc layer by vapor diffusion at 1925-2000° F. to produce a coated turbine blade.

What is claimed is:

1. A chromium-rich cathodic arc coating comprising;
   a MCrAlY cathodic arc coating on a substrate, wherein M is a metal alloy comprising nickel, cobalt, iron, or a combination thereof, and the cathodic arc coating comprises Si and 25 to 50% chromium by weight based on the weight of the MCrAl; and
   a diffused chromide coating atop the MCrAlY cathodic arc coating,
   wherein the diffused chromide coating has a higher content of chromium than the MCrAlY cathodic arc coating, the combined thickness of the diffused chromide coating and the MCrAlY cathodic arc coating is 2.5 to 3 mil (0.0635 to 0.0762 mm) and the chromium-rich cathodic arc coating has a chromium rich phase with a depth of 0.1 to 2.5 mils (0.00254 to 0.0635 mm).

2. The chromium-rich cathodic arc coating according to claim 1, wherein the surface of the diffused chromide coating atop the MCrAlY has a chromium content no less than 37% by weight.

3. The chromium-rich cathodic arc coating according to claim 2, wherein the MCrAlY has a chromium content between 25% and 35% by weight based on the weight of the MCrAlY.

4. The chromium-rich cathodic arc coating according to claim 1, wherein the MCrAlY comprises Si in an amount of 0.15 to 0.65% by weight based on the of the MCrAlY.

5. The chromium-rich cathodic arc coating according to claim 1, wherein the chromium rich phase has a depth of 0.2 to 1.0 mils (0.00508 to 0.0254 mm).

6. The chromium-rich cathodic arc coating according to claim 1, wherein the chromium-rich cathodic arc coating is resistant to hot corrosion at a temperature between 1200° F. and 1600° F.

7. The chromium-rich cathodic arc coating according to claim 1, wherein the chromium-rich cathodic arc coating is resistant to stress corrosion.

8. The chromium-rich cathodic arc coating according to claim 1, wherein the chromium-rich cathodic arc coating is resistant to low cycle fatigue.

9. The chromium-rich cathodic arc coating according to claim 1, wherein the substrate comprises a blade root, internal surface of turbine blade, or the external surface of a turbine blade.

10. An article comprising:
    a) a substrate;
    b) a MCrAlY cathodic arc coating on the substrate, wherein M is a metal alloy comprising nickel, cobalt, iron, or a combination thereof and the cathodic arc coating comprises Si and 25 to 50% chromium by weight based on the weight of the MCrAlY; and
    c) a diffused chromide coating atop the MCrAlY cathodic arc coating;
    wherein the diffused chromide coating atop the MCrAlY has a higher content of chromium than the MCrAlY cathodic arc coating, the combined thickness of the diffused chromide coating and the MCrAlY cathodic arc coating is 2.5 to 3 mil (0.0635 to 0.0762 mm), and the diffused chromide coating and the MCrAlY cathodic arc coating have a chromium rich phase with a depth of 0.1 to 2.5 mils (0.00254 to 0.0635).

11. The article according to claim 10, wherein the substrate comprises a blade root, internal surface of turbine blade, or the external surface of a turbine blade.

12. The article comprising according to claim 10, wherein the MCrAlY comprises Si in the amount of 0.15 to 0.65% by weight based on the weight of the MCrAlY.

13. The article comprising according to claim 10, wherein chromium rich phase has a depth of 0.2 to 1.0 mils (0.00508 to 0.0254 mm).

14. A method of producing a chromium-rich cathodic arc coating comprising steps of:
   a) applying a MCrAlY cathodic arc coating on a substrate, wherein M is a metal alloy comprising nickel, cobalt, iron, or a combination thereof and the cathodic arc coating comprises Si and 25 to 50% chromium by weight based on the weight of the MCrAlY; and
   b) applying a diffused chromide coating atop the MCrAlY cathodic arc coating at a temperature of 1800 to 2200° F.;
   wherein the diffused chromide coating has higher content of chromium than the MCrAlY cathodic arc coating and the combined thickness of the diffused chromide coating, the MCrAlY cathodic arc coating is 2.5 to 3 mil (0.0635 to 0.0762 mm) and the chromium-rich cathodic arc coating has a chromium rich phase with a depth of 0.1 to 2.5 mils (0.00254 to 0.0635 mm).

15. The method of claim 14, wherein the surface of the diffused chromide coating has a chromium content no less than 37% by weight.

16. The method of claim 15, wherein the MCrAlY cathodic arc coating has a chromium content of between about 25% and 35% by weight based on the weight of the MCrAlY.

17. The method of claim 14, wherein the chromium rich phase has a thickness of 0.2 to 1.0 mils (0.00508 to 0.0254 mm).

18. The method of claim 14, wherein the method of applying the diffused chromide coating atop the MCrAlY comprises pack chromizing, slurry chromizing, vapor diffusion coating, or gas diffusion coating.

* * * * *